United States Patent
Matsunaga

(10) Patent No.: US 10,510,543 B2
(45) Date of Patent: Dec. 17, 2019

(54) SEMICONDUCTOR DEVICE AND METHOD OF MANUFACTURING THEREOF

(71) Applicant: FUJI ELECTRIC CO., LTD., Kawasaki-shi, Kanagawa (JP)

(72) Inventor: Shinichiro Matsunaga, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/921,276

(22) Filed: Mar. 14, 2018

(65) Prior Publication Data
US 2018/0286683 A1  Oct. 4, 2018

(30) Foreign Application Priority Data
Mar. 28, 2017 (JP) .................................. 2017-063954

(51) Int. Cl.
| | |
|---|---|
| H01L 21/26 | (2006.01) |
| H01L 29/32 | (2006.01) |
| H01L 21/265 | (2006.01) |
| H01L 29/868 | (2006.01) |
| H01L 21/324 | (2006.01) |
| H01L 29/66 | (2006.01) |
| H01L 29/16 | (2006.01) |

(52) U.S. Cl.
CPC ...... *H01L 21/26526* (2013.01); *H01L 21/324* (2013.01); *H01L 29/32* (2013.01); *H01L 29/6606* (2013.01); *H01L 29/868* (2013.01); *H01L 29/1608* (2013.01)

(58) Field of Classification Search
CPC .... H01L 21/26; H01L 21/26526; H01L 29/32
USPC ........................................................ 257/77
See application file for complete search history.

(56) References Cited

U.S. PATENT DOCUMENTS

| | | | | |
|---|---|---|---|---|
| 6,054,369 A | * | 4/2000 | Neilson ................. | H01L 21/187 438/455 |
| 6,847,063 B2 | * | 1/2005 | Ohnishi .............. | H01L 29/1004 257/19 |

(Continued)

FOREIGN PATENT DOCUMENTS

| | | |
|---|---|---|
| JP | 2009-088223 A | 4/2009 |
| JP | 2015-053427 A | 3/2015 |

*Primary Examiner* — Fazli Erdem
(74) *Attorney, Agent, or Firm* — Rabin & Berdo, P.C.

(57) ABSTRACT

A semiconductor device includes an n⁻-type drift layer of an formed on an n⁺-type SiC substrate; a p-type layer provided on a surface opposite that facing the n⁺-type SiC substrate; and an n-type buffer layer provided, as a recombination promoting layer, between the n⁻-type drift layer and the n⁺-type SiC substrate, the n-type buffer layer having an impurity concentration higher than that of the n⁻-type drift layer. In the buffer layer, as a recombination site, a defect energy-level is introduced at a high concentration of $1 \times 10^{12}/cm^3$ or higher. The buffer layer promotes internal electron-hole recombination and without applying high energy to BPDs at an interface of the buffer layer and the SiC substrate, may reduce the amount of recombination near the interface even at a current density equivalent to that of a conventional structure and thereby, prevents characteristics degradation at the time of operation.

10 Claims, 5 Drawing Sheets

(56) References Cited

U.S. PATENT DOCUMENTS

| | | | |
|---|---|---|---|
| 2004/0065878 A1* | 4/2004 | Ohnishi | H01L 29/1004 257/47 |
| 2009/0085044 A1 | 4/2009 | Ohno et al. | |
| 2009/0224284 A1* | 9/2009 | Nemoto | H01L 21/2255 257/109 |
| 2013/0183820 A1* | 7/2013 | Hiyoshi | H01L 21/3065 438/589 |
| 2014/0374882 A1* | 12/2014 | Siemieniec | H01L 21/324 257/618 |
| 2015/0115283 A1* | 4/2015 | Domeij | H01L 29/32 257/77 |
| 2016/0005605 A1* | 1/2016 | Nishio | H01L 21/324 257/77 |
| 2016/0149056 A1* | 5/2016 | Nishio | H01L 29/8611 257/77 |
| 2016/0197155 A1* | 7/2016 | Hiyoshi | H01L 21/02008 257/77 |
| 2016/0218176 A1* | 7/2016 | Hiyoshi | H01L 21/046 |
| 2016/0365250 A1* | 12/2016 | Matsui | H01L 21/221 |
| 2017/0141206 A1* | 5/2017 | Koga | H01L 21/263 |
| 2017/0200787 A1* | 7/2017 | Shimizu | H01L 21/02529 |
| 2018/0182844 A1* | 6/2018 | Nakamura | H01L 21/26513 |

\* cited by examiner

FIG.2

| | DIODE WITH ONLY CONVERSION LAYER (CONVENTIONAL STRUCTURE) | DIODE WITH DEFECT ENERGY-LEVEL INTRODUCED OVERALL (CONVENTIONAL STRUCTURE) | DIODE WITH BUFFER LAYER (CONVENTIONAL STRUCTURE) | DIODE WITH BUFFER LAYER INTRODUCED WITH DEFECT ENERGY-LEVEL (EMBODIMENT) |
|---|---|---|---|---|
| DENSITY OF HOLES REACHING SUBSTRATE | $6.0\mathrm{e}15/cm^3$ | $1.3\mathrm{e}8/cm^3$ | $1.3\mathrm{e}15/cm^3$ | $1.0\mathrm{e}13/cm^3$ |
| FORWARD OPERATING VOLTAGE | 3.26 V | 27.1 V | 3.25 V | 3.51 V |

SEMICONDUCTOR DEVICE AND METHOD OF MANUFACTURING THEREOF

TECHNICAL FIELD

The present invention relates to a semiconductor device and a method of manufacturing the semiconductor device.

BACKGROUND ART

In bipolar devices containing a wide bandgap semiconductor material such as SiC or unipolar devices containing a wide bandgap semiconductor material such as SiC and caused to perform bipolar operation such as that occurring with movement of minority carriers, high energy is generated at the time of hole-electron recombination due to the wide bandgap. Such recombination occurs near basal plane dislocations (BPDs) and thus, a phenomenon is observed in which the high energy causes defects and translocations to become stacking faults and expand, whereby degradation phenomena such as increases in ON resistance are observed.

Conventionally, degradation is prevented by a conversion layer structure that at a very high ratio (e.g., 99%, etc.), converts basal plane dislocations (BPDs) present at an interface of a substrate and an epitaxial layer, into threading edge dislocations (TEDs), etc., which have a low impact on electrical characteristics (for example, refer to Patent Document 1).

Further, a scheme has been proposed in which $Z_{1/2}$ centers (carbon vacancy defect energy-level) at a density lower than the dopant concentration is introduced in a drift layer that is a low-dopant region constituting a breakdown voltage maintaining layer, whereby without significantly affecting unipolar operation, killing of minority carriers at the time of bipolar operation decreases the minority carriers that reach the substrate decrease and no high energy due to recombination to BPDs in the substrate is generated (for example, refer to Patent Document 2).

PRIOR ART LITERATURE

[Patent Document 1] Japanese Laid-Open Patent Publication No. 2009-088223
[Patent Document 2] Japanese Laid-Open Patent Publication No. 2015-053427

DISCLOSURE OF INVENTION

Problem to be Solved by the Invention

In an instance of high density current at the time of bipolar operation, defect propagation may occur due to the high energy generated by hole-electron recombination to BPDs at an interface of a buffer layer and a conversion layer or in the substrate. Therefore, a problem arises in that degradation of ON resistance characteristics cannot be completely prevented.

Further, when a large amount of defect energy-levels about equal to the impurity concentration or less is introduced in the drift layer, although resistivity at the time of unipolar operation does not degrade much, minority carriers in the drift layer decrease, whereby resistivity at the time of bipolar element operation increases to about the same as that at the time of unipolar operation, whereby the low conduction loss capability of the bipolar element cannot be taken advantage of. Even when a unipolar element (e.g., MOS transistor) is used, under specific operation conditions, a built-in PN diode may operate (e.g., during dead time of a MOS used for synchronous rectification with inductance as a load, etc.), and in this case, conduction loss increases.

To solve the problems associated with the conventional arts above, one object of the present invention is to prevent degradation of ON resistance characteristics due to defect expansion while preventing degradation of conduction loss at the time of bipolar operation.

Means for Solving Problem

To solve the problems above and achieve an object of the present invention, a semiconductor device according to the present invention is characterized in that the semiconductor device includes a high-resistance first semiconductor region of a first conductivity type formed on a semiconductor substrate of the first conductivity type, the high-resistance first semiconductor region having a low impurity concentration; a second semiconductor region of a second conductivity type provided at a surface opposite that facing the semiconductor substrate; and a third semiconductor region of the first conductivity type provided between the high-resistance first semiconductor region and the semiconductor substrate, as a recombination promoting layer, the third semiconductor region having an impurity concentration higher than an impurity concentration of the high-resistance first semiconductor region, wherein the third semiconductor region includes a defect energy-level introduced as a recombination site, the defect energy-level being introduced at a high concentration of at least $1\times10^{12}/cm^3$.

Further, the semiconductor device is characterized in that a $Z_{1/2}$ energy-level that is a carbon deficiency defect energy-level is used as a recombination site in the third semiconductor region.

A method of manufacturing a semiconductor device according to the present invention is characterized in that the method includes a process of forming a high-resistance first semiconductor region of a first conductivity type on a semiconductor substrate of the first conductivity type, the high-resistance first semiconductor region having a low impurity concentration; a process of forming a second semiconductor region of a second conductivity type on a surface opposite that facing the semiconductor substrate; and a process of forming a third semiconductor region of the first conductivity type between the high-resistance first semiconductor region and the semiconductor substrate, as a recombination promoting layer, the third semiconductor region having an impurity concentration higher than an impurity concentration of the high-resistance first semiconductor region, wherein the third semiconductor region includes a defect energy-level introduced as a recombination site and introduced at a high concentration of at least $1\times10^{12}/cm^3$.

Further, the method is characterized in that the method further includes a process of introducing the defect energy-level in the third semiconductor region and the high-resistance first semiconductor region overall by carbon loss; and a process of reducing carbon vacancy defects only at a region closer than the third semiconductor region, to a front surface, the carbon vacancy defects being reduced by one among annealing for a long period after carbon implantation and oxidation for a long period after carbon capping.

Further, the method is characterized in that one among irradiating an electron beam and irradiating protons on the third semiconductor region is performed, and a predetermined defect energy-level is introduced.

According to the configuration above, the minority carrier density in the drift layer may be kept high by a potential barrier due to the high impurity concentration of the buffer layer and therefore, resistivity at the time of bipolar operation is reduced. Normally, in a high voltage device, the drift layer is thick and the carrier density is low. Therefore, when the minority carrier density in drift layer decreases, the resistivity at the time of bipolar operation increases. In the embodiments of the present invention, no defect energy-level is introduced in the drift layer and therefore, increases in resistance do not occur.

Compared to the drift layer, the buffer layer has a high impurity concentration and many carriers and thus, has low resistance, and since the thickness is thin (e.g., about 1 µm to 10 µm), even when carriers in the buffer layer decrease, increases in resistance at the time of bipolar operation are small. Therefore, even when hole-electron recombination is promoted and carriers decrease according to the defect energy-level, a low resistance at the time of bipolar operation may be maintained.

In the buffer layer, electron-hole recombination by Auger recombination due to the high impurity concentration is promoted. Since recombination is further promoted via a deep defect energy-level introduced in the buffer layer, in the buffer layer, the minority carriers nearly disappear and recombination in the substrate or at the interface of the buffer layer and the conversion layer becomes very low and therefore, no high energy is applied to BPDs present near these. As a result, BPD expansion is suppressed and characteristics degradation at the time of operation may be prevented.

Effect of the Invention

The semiconductor device and the method of manufacturing the semiconductor device according to the present invention achieve an effect in that degradation of ON resistance characteristics due to defect expansion may be prevented while degradation of conduction loss at the time of bipolar operation is prevented.

BRIEF DESCRIPTION OF DRAWINGS

FIG. 2 is a chart depicting forward operating voltage and density of holes reaching a substrate in the embodiment and in a conventional semiconductor device;

BEST MODE(S) OF CARRYING OUT THE INVENTION

Figure 1:
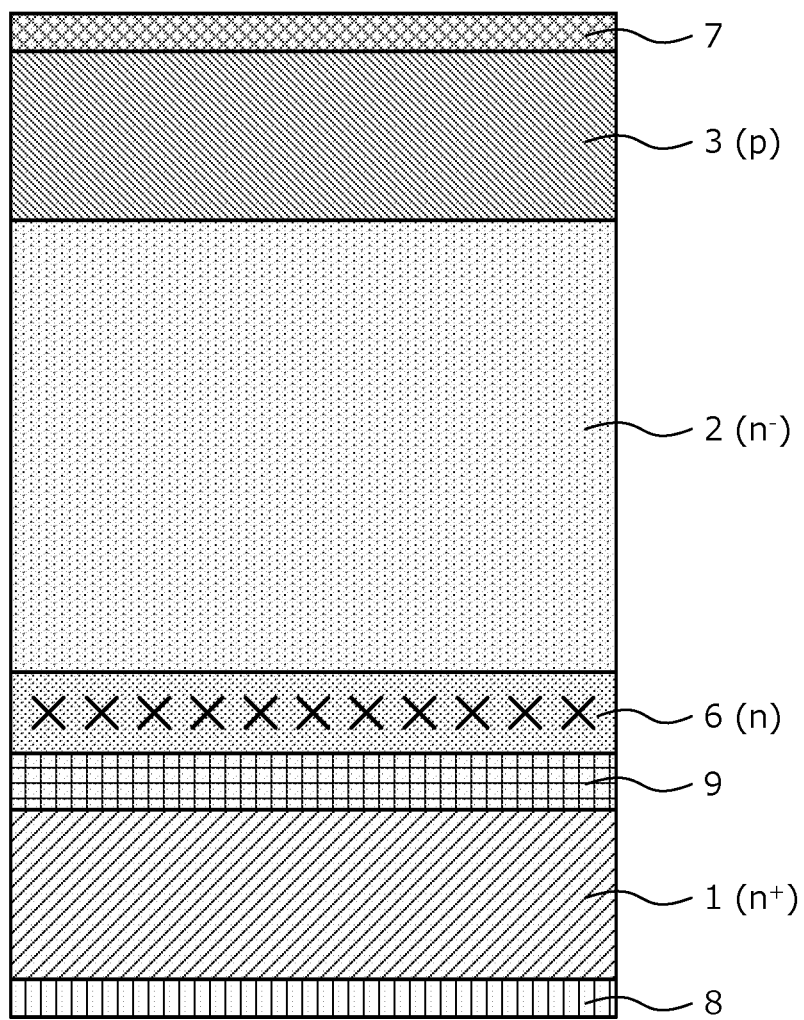
FIG. 1 is a cross-sectional view of a structure of a semiconductor device according to an embodiment.

Preferred embodiments of a semiconductor device according to the present invention will be described in detail with reference to the accompanying drawings. In the present description and accompanying drawings, layers and regions prefixed with n or p mean that majority carriers are electrons or holes. In the description of the embodiments below and the accompanying drawings, main portions that are identical will be given the same reference numerals and will not be repeatedly described.

Embodiment

A structure of the semiconductor device according to an embodiment will be described. FIG. 1 is a cross-sectional view of the structure of the semiconductor device according to the embodiment. A SiC PIN diode containing SiC in a semiconductor substrate will be described as an example of the semiconductor device. Description will be given using an example in which a first conductivity type is an n-type and a second conductivity type is a p-type.

By epitaxial growth, a conversion layer 9 for BPD→TED conversion is formed on an n$^+$-type SiC substrate 1 having a high concentration (e.g., $1 \times 10^{19}$/cm$^3$), and a buffer layer 6 of an n-type and promoting recombination is formed on the conversion layer 9.

The buffer layer 6 has, for example, a concentration of $1 \times 10^{18}$/cm$^3$ or higher and a thickness of 1 µm or greater. When the buffer layer 6 is formed, a C/Si ratio is adjusted so that an energy-level of a carbon vacancy defect is introduced, whereby the buffer layer 6 is formed as a buffer layer in which a defect energy-level has been introduced. A density of the introduced defect energy-level density is, for example, about $1 \times 10^{12}$/cm$^3$ or higher. The buffer layer 6 itself functions as a recombination promoting layer, however, due to the density of the defect energy-level at the predetermined high concentration described, the buffer layer 6 functions as a recombination site promoting recombination. As a recombination site, a $Z_{1/2}$ energy-level that is a carbon deficiency defect energy-level may be used.

On the buffer layer 6, a drift layer (high-resistance semiconductor region) 2 containing an n$^-$-type SiC at a concentration of, for example, about $1 \times 10^{14}$/cm$^3$ or higher is formed by epitaxial growth or the like. The drift layer 2 constitutes a breakdown voltage sustaining layer. While a concentration and thickness of the drift layer 2 varies according to the breakdown voltage, for example, for a 1200V element, the concentration is about $1 \times 10^{15}$/cm$^3$ or higher and the thickness is about 10 µm or greater, and for a 20 kV element, the concentration is about $4 \times 10^{14}$/cm$^3$ or lower and the thickness is about 150 µm or greater.

Next, on the drift layer 2, a p-type-impurity epitaxial layer is formed or a p-type layer (second semiconductor region) 3 having a high concentration is formed by ion implantation, creating a PIN diode. A concentration of the p-type layer 3 may be $1 \times 10^{16}$/cm$^3$ or higher, which is sufficiently higher than the concentration of the drift layer 2 and a thickness of the p-type layer 3 may be about 0.1 to several µm. When the concentration of the p-type layer 3 is not sufficiently higher than the impurity concentration of the drift layer 2 and the thickness of the p-type layer 3 is thin, breakdown voltage decreases due to punch-though to an upper electrode and therefore, caution is necessary.

Subsequently, in a case where the p-type layer 3 is formed by epitaxial growth, an edge termination structure that mitigates electric field in a lateral direction of the p-type layer 3 is formed after a high-concentration p-type region is removed by etching a part of an outer periphery of the p-type layer 3 to form a low-concentration p-type region at a periphery. Subsequently, a front electrode 7 and a rear electrode 8 are each formed.

In a structure of the PIN diode above, a high-concentration impurity layer (the buffer layer 6) is provided and has a much higher impurity concentration (e.g., about $1 \times 10^{18}$/cm$^3$ of higher) than the epitaxial layer (the drift layer 2) having a low impurity concentration and sustaining the breakdown voltage.

A minority carrier density in the drift layer 2 may be kept high by a potential barrier due to the high impurity concentration of the buffer layer 6 and therefore, resistivity at the time of bipolar operation may be reduced. Normally, in a high voltage device, the drift layer 2 is thick and the carrier density is low. Therefore, when the minority carrier density in the drift layer 2 decreases, the resistivity at the time of bipolar operation increases. Thus, in the embodiment, in the drift layer 2, since no defect energy-level is introduced, increases in resistance do not occur.

Compared to the drift layer 2, the buffer layer 6 has a high impurity concentration and many carriers and thus, has low resistance, and since the thickness is thin (e.g., about 1 μm to 10 μm), even when carriers in the buffer layer 6 decrease, increases in resistance at the time of bipolar operation are small. Therefore, even when hole-electron recombination is promoted and carriers decrease according to the defect energy-level, a low resistance at the time of bipolar operation may be maintained.

In the buffer layer 6, electron-hole recombination by Auger recombination due to the high impurity concentration is promoted. Since recombination is further promoted via a deep defect energy-level introduced in the buffer layer 6, in the buffer layer 6, the minority carriers nearly disappear and recombination at the interface of the buffer layer 6 and the conversion layer 9, or in the n$^+$-type SiC substrate 1 becomes very low and therefore, no high energy is applied to BPDs present near the interface. As a result, BPD expansion is suppressed and characteristics degradation may be prevented.

Second Embodiment

The PIN diode of a second embodiment has substantially the same structure that is described in the first embodiment and that includes the buffer layer 6. In the second embodiment, on the n$^+$-type SiC substrate 1 having a high concentration (e.g., $1 \times 10^{19}/cm^3$), during the epitaxial growth of the buffer layer 6 of an n-type and the drift layer 2, etc., in the drift layer 2 and the buffer layer 6 overall, the C/Si ratio is adjusted so that a defect energy-level is introduced due to carbon loss.

Subsequently, before electrode (the front electrode 7 and the rear electrode 8) formation, carbon vacancy defects are reduced by annealing for a long period after carbon implantation or by oxidation for a long period after carbon capping; the carbon vacancy are reduced only at a region closer than the buffer layer 6, to a front surface. Other aspects are the same processes and structures as in the first embodiment.

Third Embodiment

The PIN diode of a third embodiment has substantially the same structure that is described in the first embodiment and that includes the buffer layer 6. In the third embodiment, on the n$^+$-type SiC substrate 1 having a high concentration (e.g., $1 \times 10^{19}/cm^3$), the conversion layer 9 for BPD→TED conversion is formed by epitaxial growth or the like. Then, on the conversion layer 9, the buffer layer 6 of an n-type and promoting recombination is formed by epitaxial growth or the like and has, for example, a concentration of $1 \times 10^{18}/cm^3$ or higher, and a thickness of 1 μm or greater.

After formation of the buffer layer 6, electron beam irradiation or proton irradiation is performed so as to introduce a defect energy-level in the buffer layer 6. The density of the introduced defect energy-level is, for example, about $1 \times 10^{12}/cm^3$ or higher. Other aspects are the same processes and structures as in the first embodiment.

According to the embodiments, even with operation at a high current density, characteristics degradation such as increases in ON resistance due to defect expansion may be prevented. Further, compared to a case in which a defect energy-level is introduced in a semiconductor element overall, resistivity at the time of bipolar operation may be reduced. Furthermore, compared to a case where a defect energy-level is introduced in a semiconductor element overall, resistivity at the time of unipolar operation may be reduced. Introduction of a defect energy-level enables minority carriers to be inhibited from reaching the semiconductor substrate even with high current density, whereby the thickness of the high-concentration buffer may be reduced, achieving an effect in that device fabrication costs may be reduced.

Figure 3:
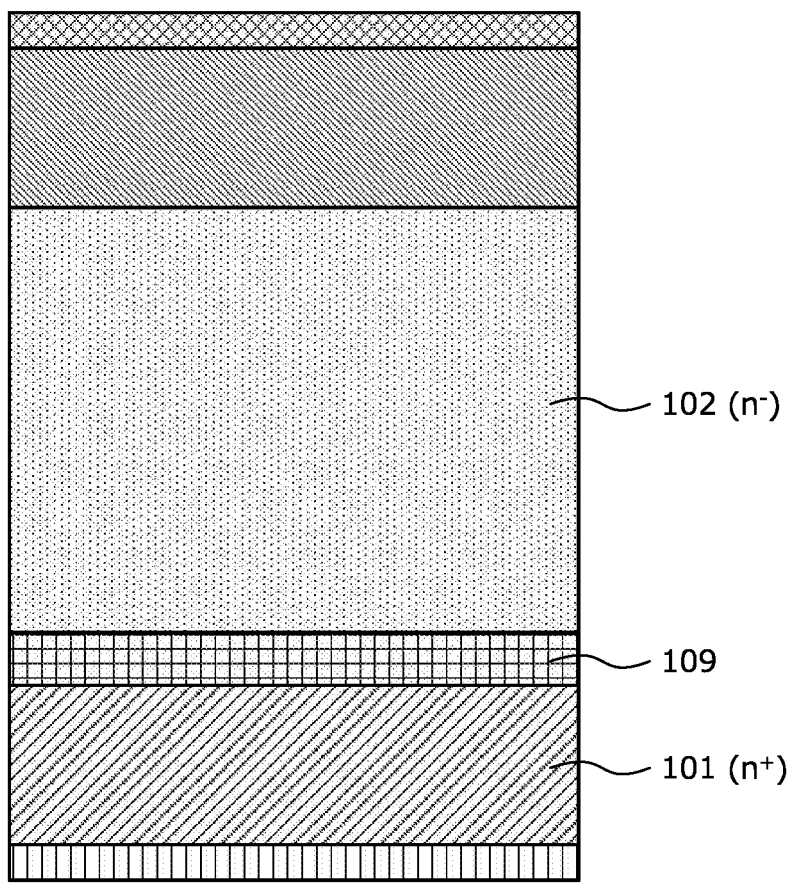
FIG. 3 is a cross-sectional view of a structure of components in a conventional semiconductor device.
Figure 4:
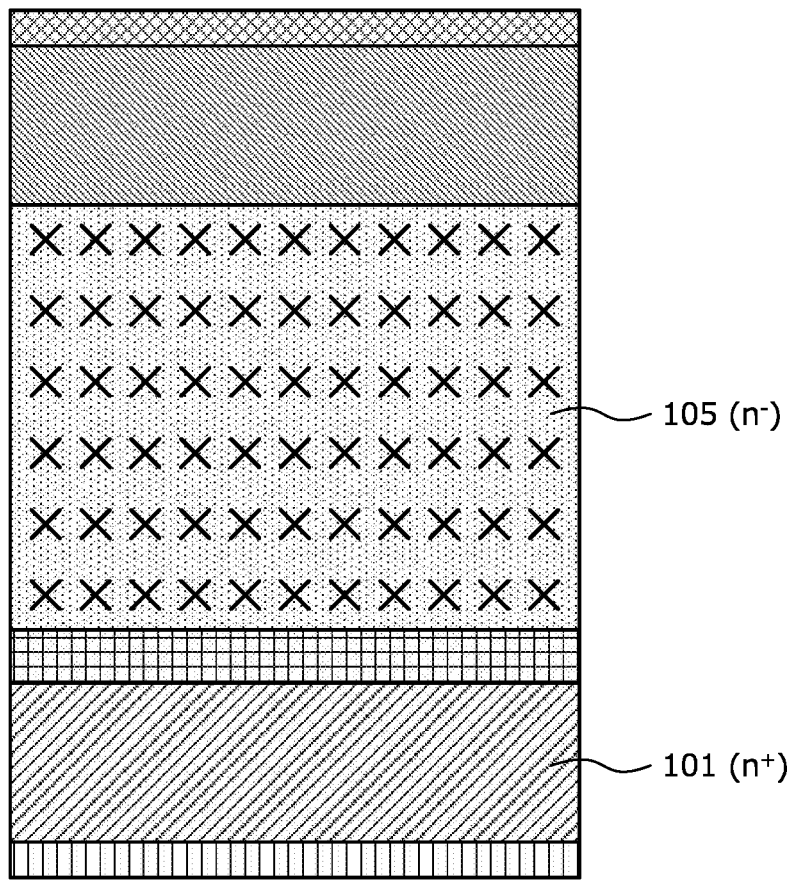
FIG. 4 is a cross-sectional view of a structure of components in a conventional semiconductor device.
Figure 5:
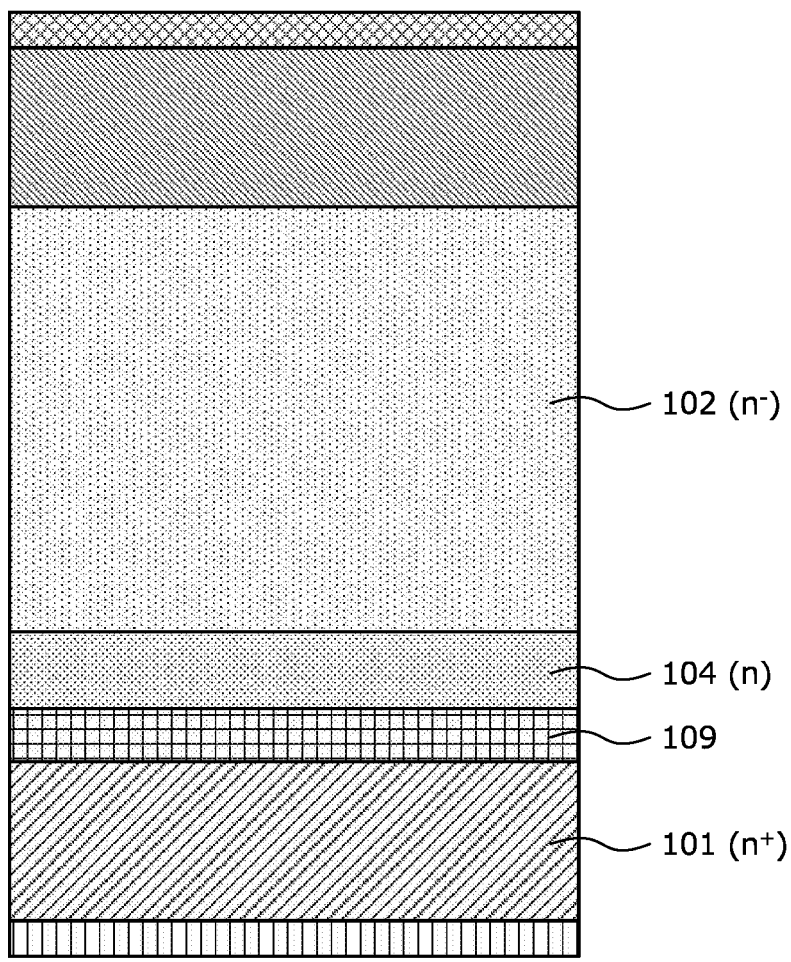
FIG. 5 is a cross-sectional view of a structure of components in a conventional semiconductor device.

FIG. 2 is a chart depicting forward operating voltage and density of holes reaching the substrate in the embodiment and in a conventional semiconductor device. FIGS. 3 to 5 are cross-sectional views of a structure of components the conventional semiconductor devices. FIG. 3 depicts a structure without a buffer layer and having only a conversion layer 109. FIG. 4 depicts a structure having in a drift layer overall, an n$^-$-type drift layer 105 in which a defect energy-level of $1 \times 10^{13}/cm^3$ is introduced. FIG. 5 depicts a structure having a conversion layer 109 and a buffer layer 104.

FIG. 2 depicts operating voltage values and density values of minority carriers (in this case, holes) reaching a vicinity of the n$^+$-type SiC substrates 1, 101/the drift layers 2, 102 of the above four types of diodes (1) to (4) operating at a same current density (100 A/cm$^2$) estimated by simulation.

(1) 13 kV PIN diode without high-impurity-concentration buffer layer (conventional structure, FIG. 3)
(2) PIN diode having the n$^-$-type drift layer 105 in which a defect energy-level of $1 \times 10^{13}/cm^3$ is introduced in the drift layer overall (conventional structure, FIG. 4)
(3) PIN-type diode having the n-type buffer layer 104 of a high impurity concentration ($5 \times 10^{18}/cm^3$) and a thickness of 5 μm (conventional structure, FIG. 5)
(4) PIN diode having the buffer layer 6 of a high impurity concentration that is the same as the defect energy-level of $1 \times 10^{13}/cm^3$ introduced only in the buffer layer (first embodiment, FIG. 1)

As depicted in FIG. 2, use of the structure of the embodiment enables increases of the operating voltage to be suppressed to about 0.3V or less while the density of minority carriers (in this case, holes) near the n$^+$-type SiC substrate 1/the drift layer 2 is reduced to 1/100 or less of that in the conventional structures (1), (3). Further, in the conventional structure (2) in which a defect energy-level is introduced overall, although minority carriers may be suppressed to an extent that minority carriers are substantially not present, operation becomes substantially unipolar operation and the operating voltage becomes 27V and therefor, conduction loss increases significantly.

In the embodiments, although a PIN diode formed on an n-type SiC substrate has been described as an example, application to a similar device of different polarities (e.g., NIP diode on a p-type substrate) is similarly possible. Further, application is similarly possible to a built-in PN diode in a unipolar device such as a MOS. Application to an IGBT, a thyristor, etc. is further possible. Application to a semiconductor device, etc. that uses a substrate containing another wide bandgap material (GaN, gallium oxide, etc.) is also possible.

In the embodiments, various modifications within a scope not departing from the spirit of the present invention are possible. In the embodiments, for example, dimensions, impurity concentration, etc. of regions may be variously set according to required specifications. Further, in the embodiments, although the first conductivity type is assumed to be an n-type and the second conductivity type is assumed to be a p-type, the present invention is similarly implemented when the first conductivity type is a p-type and the second conductivity type is an n-type.

INDUSTRIAL APPLICABILITY

As described, the semiconductor device and the method of manufacturing the semiconductor device according to the embodiments of the present invention is useful for bipolar semiconductor devices having a high breakdown voltage.

EXPLANATIONS OF LETTERS OR NUMERALS 1 semiconductor substrate (n$^+$-type SiC substrate)
2 n$^-$-type drift layer
3 p-type layer
4 n-type buffer layer
5 n$^-$-type drift layer in which defect energy-level is introduced
6 n-type buffer layer in which defect energy-level is introduced
7 front electrode
8 rear electrode
9 conversion layer

The invention claimed is:

1. A semiconductor device, comprising:
a semiconductor substrate of a first conductivity type;
a high-resistance first semiconductor region of the first conductivity type, having a first surface and a second surface opposite to the first surface, and being formed on the semiconductor substrate, the second surface facing the semiconductor substrate;
a second semiconductor region of a second conductivity type provided at the first surface of the high-resistance first semiconductor region; and
a third semiconductor region of the first conductivity type provided between the high-resistance first semiconductor region and the semiconductor substrate, as a recombination promoting layer, the third semiconductor region having an impurity concentration higher than an impurity concentration of the high-resistance first semiconductor region, the third semiconductor region having defects each of which functions as a recombination site, a concentration of the defects in the third semiconductor region being higher than $1\times10^{12}/cm^3$, the third semiconductor region having a $Z_{1/2}$ energy-level that is a carbon deficiency defect energy-level introduced by the defects.

2. A method of manufacturing a semiconductor device, comprising:
forming a high-resistance first semiconductor region of the first conductivity type on a semiconductor substrate of the first conductivity type, the high-resistance first semiconductor region having an impurity concentration lower than an impurity concentration of the third semiconductor region;
forming a second semiconductor region of a second conductivity type on the high-resistance first semiconductor region; and
forming a third semiconductor region of the first conductivity type, the third semiconductor region being disposed between the high-resistance first semiconductor region and the semiconductor substrate, as a recombination promoting layer, the third semiconductor region having an impurity concentration higher than an impurity concentration of the high-resistance semiconductor region, the third semiconductor region having defects each of which functions as a recombination site, a concentration of the defects in the third semiconductor region being higher than $1\times10^{12}/cm^3$, the third semiconductor region having a $Z_{1/2}$ energy-level that is a carbon deficiency defect energy-level introduced by the defects.

3. The method according to claim 2, further comprising:
introducing a defect energy-level by carbon loss in entire area of each of the third semiconductor region and the high-resistance first semiconductor region, thereby introducing a carbon vacancy defect in the third semiconductor region and the high-resistance first semiconductor region; and
reducing the carbon vacancy defects only at an upper region of the third semiconductor region with respect to the substrate.

4. The method according to claim 2, wherein said forming a third semiconductor region includes irradiating either an electron beam or protons on the third semiconductor region, thereby introducing the defect energy-level.

5. The method according to claim 3, further comprising performing carbon implantation on the second semiconductor region, wherein
reducing the carbon vacancy defect includes annealing after the carbon implantation is performed.

6. The method according to claim 3, further comprising forming a carbon cap on the second semiconductor region, wherein
reducing the carbon vacancy defect includes performing an oxidization after the carbon cap is formed.

7. The semiconductor device according to claim 1, wherein the third semiconductor region has the impurity concentration lower than an impurity concentration of the semiconductor substrate.

8. The semiconductor device according to claim 1, wherein the third semiconductor region includes equal to or more than $1\times10^{18}/cm^3$ of n-type impurities.

9. The method according to claim 2, wherein the third semiconductor region has the impurity concentration lower than an impurity concentration of the semiconductor substrate.

10. The method according to claim 2, wherein the third semiconductor region includes equal to or more than $1\times10^{18}/cm^3$ of n-type impurities.

* * * * *